United States Patent
Shen et al.

(10) Patent No.: US 7,639,092 B2
(45) Date of Patent: Dec. 29, 2009

(54) CRYSTAL OSCILLATOR FREQUENCY TUNING CIRCUIT

(75) Inventors: David H. Shen, Saratoga, CA (US); Ann P. Shen, Saratoga, CA (US)

(73) Assignee: NanoAmp Solutions Inc. (Cayman), Santa Clara, CA (US)

( * ) Notice: Subject to any disclaimer, the term of this patent is extended or adjusted under 35 U.S.C. 154(b) by 14 days.

(21) Appl. No.: 11/837,042

(22) Filed: Aug. 10, 2007

(65) Prior Publication Data
US 2009/0039970 A1    Feb. 12, 2009

(51) Int. Cl.
*H03B 5/36* (2006.01)
(52) U.S. Cl. .................. 331/36 C; 331/158; 331/177 V
(58) Field of Classification Search ............... 331/36 C, 331/158, 177 V
See application file for complete search history.

(56) References Cited

U.S. PATENT DOCUMENTS

| | | | |
|---|---|---|---|
| 5,084,685 A | 1/1992 | Möller et al. | |
| 5,117,206 A | 5/1992 | Imamura | |
| 5,117,234 A | 5/1992 | Shizawa | |
| 5,874,864 A * | 2/1999 | Muto et al. | 331/66 |
| 6,181,218 B1 | 1/2001 | Clark et al. | |
| 6,304,152 B1 | 10/2001 | Takahashi et al. | |
| 6,747,522 B2 | 6/2004 | Pietruszynski et al. | |
| 6,788,159 B2 * | 9/2004 | Takahashi et al. | 331/176 |
| 6,980,139 B2 | 12/2005 | Doerrer et al. | |

OTHER PUBLICATIONS

Notification of Transmittal of the International Search Report and the Written Opinion of the International Search Authority, or the Declaration, PCT/SU07/75691, mailed Sep. 24, 2008.

* cited by examiner

*Primary Examiner*—Robert Pascal
*Assistant Examiner*—James E Goodley
(74) *Attorney, Agent, or Firm*—Fish & Richardson P.C.

(57) ABSTRACT

Embodiments feature techniques and systems for analog and digital tuning of crystal oscillators. In one aspect, some implementations feature a method for tuning a frequency of a crystal oscillator that can include adjusting the tuning frequency of the crystal oscillator from a nominal frequency via a switched-capacitor frequency tuning circuit, the switched-capacitor frequency tuning circuit can have switchable sections to adjust the tuning of the crystal oscillator. The method can include controlling an analog control input that is coupled to a varactor within each of the switchable sections, where each of the switchable sections can include a fixed capacitor in series with the varactor and a switch. The method can involve controlling a digital control input, where the digital control input can electrically connect or disconnect one or more of the switchable sections from the crystal. There can be independent control between the digital and analog tuning mechanisms.

43 Claims, 6 Drawing Sheets

CRYSTAL OSCILLATOR FREQUENCY TUNING CIRCUIT

TECHNICAL FIELD

The present disclosure relates to circuitry, such as oscillators, for wireline and wireless communications.

BACKGROUND

Crystal oscillators are used frequently as a source of frequency stability for various communications systems. The crystal is typically made of quartz and has resonating capabilities. Quartz is a material with piezoelectric properties that can be cut at certain angles and thicknesses to provide electrical and mechanical stability in radio frequency (RF) circuit designs. A typical crystal oscillator can be manufactured to achieve tolerances of less than 10 ppm (parts per million), but larger tolerances tend to be less expensive to manufacture. The crystal can be "tuned," that is, adjusting the resonant frequency to a desired frequency through open-loop or closed-loop control in order to achieve tighter tolerances or to ease manufacturing requirements.

Because the crystal oscillator is an inherently stable resonator, this oscillator can be used in many types of electronic oscillator circuit topologies. For example, these oscillator circuit topologies can include the Colpitts, Hartley, and Pierce oscillator circuit topologies.

SUMMARY

The present disclosure describes techniques, circuits, and systems for analog and digital tuning of crystal oscillators. In general, in one aspect, implementations can feature a method for tuning a frequency of a crystal oscillator that includes adjusting the tuning frequency of the crystal oscillator from a nominal frequency via a first switched-capacitor frequency tuning circuit. The crystal oscillator includes an amplifier and a crystal, and the first switched-capacitor frequency tuning circuit is coupled to a first node of the crystal. The first switched-capacitor frequency tuning circuit includes switchable sections to adjust the tuning of the crystal oscillator, and the switchable sections in the first switched-capacitor frequency tuning circuit includes an analog control input and a digital control input. The method includes controlling the analog control input coupled to a node within each of the switchable sections, where each of the switchable sections in the first switched-capacitor frequency tuning circuit includes a fixed capacitor in series with a varactor and a switch. The node within each of the switchable sections includes a node to control the varactor within each of the switchable sections. The method includes controlling the digital control input, where the digital control input is configured to electrically connect or disconnect one or more of the switchable sections from the first node of the crystal.

These and other implementations can optionally include one or more of the following features. The node to control the varactor within each of the switchable sections can be a common node in all of the switchable sections in the first switched-capacitor frequency tuning circuit. The method can include receiving a multi-bit digital code on the digital control input to control the electrical connection or disconnection of each of the switchable sections, where each bit in the multi-bit digital code can be configured to control a connection or disconnection of the switch within one of the switchable sections in the first switched-capacitor frequency tuning circuit. A ratio between the capacitance of the varactor to a capacitance of the capacitor can include a constant ratio for each switchable section in the first switched-capacitor frequency tuning circuit. A total equivalent capacitance of the switched-capacitor frequency tuning circuit can be a function of the constant ratio.

The method can also include adjusting the tuning frequency of the crystal oscillator from a nominal frequency via a second switched-capacitor frequency tuning circuit that is coupled to a second node of the crystal. The second switched-capacitor frequency tuning circuit can include switchable sections to adjust the tuning of the crystal oscillator. Each of the switchable sections in the second switched-capacitor frequency tuning circuit can include a fixed capacitor in series with a varactor and a switch. The switchable sections in the second switched-capacitor frequency tuning circuit can include the analog control input and the digital control input. The method can include controlling the analog control input to each of the switchable sections in the second switched-capacitor frequency tuning circuit. The analog control input can be coupled to a node within each of the switchable sections in the second switched-capacitor frequency tuning circuit. The node within each of the switchable sections in the second switched-capacitor frequency tuning circuit can include a node to control the varactor within each of the switchable sections. The method can involve controlling the digital control input, where the digital control input is coupled to the switch within each of the switchable sections in the second switched-capacitor frequency tuning circuit to electrically connect or disconnect one or more switchable sections from the crystal.

In general, some implementations can feature a circuit for tuning a frequency of a crystal oscillator. The circuit includes an oscillator circuit that includes an amplifier in parallel with a crystal. The circuit has a first capacitor coupled to a first node of the crystal and a second capacitor coupled to a second node of the crystal. The first and second capacitors are configured for nominal tuning of the crystal oscillator. The circuit has a first switched-capacitor frequency tuning circuit coupled to the second node of the crystal, where the first switched-capacitor frequency tuning circuit includes switchable sections to adjust the tuning of the crystal oscillator. The circuit includes an analog control input coupled to a varactor within each of the switchable sections. The circuit includes a digital control input coupled to a switch within each of the switchable sections to electrically connect or disconnect one or more of the switchable sections from the second node of the crystal.

These and other implementations can optionally include one or more of the following features. Each of the switchable sections can include a fixed capacitor in series with the varactor and the switch. The analog control input can be configured to control the varactor within each of the switchable sections in the first switched-capacitor frequency tuning circuit. The digital control input can be configured to carry a multi-bit digital code, where each bit in the multi-bit digital code can be configured to control an on or off position of the switch in one of the switchable sections in the first switched-capacitor frequency tuning circuit. The digital control input can be configured to be independent of the analog control input.

A ratio between a capacitance of the varactor to a capacitance of the capacitor can involve a constant ratio for each switchable section in the first switched-capacitor frequency tuning circuit. A total equivalent capacitance of the switched-capacitor frequency tuning circuit can be a function of the constant ratio. A tuning sensitivity of the crystal can be a function of the constant ratio.

The circuit can also include a second switched-capacitor frequency tuning circuit coupled to the first node of the crystal, where the second switched-capacitor frequency tuning circuit can include switchable sections to adjust the tuning of the crystal oscillator. The analog control input can be coupled to a varactor within each of the switchable sections in the second switched-capacitor frequency tuning circuit. The digital control input can be coupled to a switch within each of the switchable sections in the second switched-capacitor frequency tuning circuit to electrically connect or disconnect one or more of the switchable sections from the first node of the crystal.

Each of the switchable sections in the second switched-capacitor frequency tuning circuit can include a fixed capacitor in series with the varactor and the switch. The analog control input can be configured to control the varactor within each of the switchable sections in the second switched-capacitor frequency tuning circuit. Each bit in the multi-bit digital code can be configured to control an on or off position of the switch in one of the switchable sections in the second switched-capacitor frequency tuning circuit. A ratio between a capacitance of the varactor to a capacitance of the capacitor within the second switched-capacitor frequency tuning circuit can involve a constant ratio for each switchable section in the second switched-capacitor frequency tuning circuit.

In general, some implementations can feature a system that has a crystal oscillator circuit, a first capacitor coupled to a first node of the crystal oscillator circuit, and a second capacitor coupled to a second node of the crystal oscillator circuit. The system includes a first frequency tuning circuit to adjust a frequency of the crystal oscillator circuit, where the first frequency tuning circuit includes switchable sections, and each switchable section includes a capacitor in series with a switch and a varactor. The system includes a digitally-controlled input coupled to each switch within each switchable section to control an electrical connection or disconnection of each switchable section in the first frequency tuning circuit to the second node of the crystal oscillator circuit. The system also has an analogically-controlled input coupled to a commonly-shared node in all of the switchable sections in the first frequency tuning circuit. The commonly-share node is configured to control the varactor within each of the switchable sections in the first frequency tuning circuit.

These and other implementations can optionally include one or more of the following features. The digitally-control input can be independent of the analogically-control input. A ratio between a capacitance of the varactor to a capacitance of the capacitor can be a constant ratio for each switchable section in the first frequency tuning circuit. A total equivalent capacitance of the frequency tuning circuit can be a function of the constant ratio. A tuning sensitivity of the crystal can include a function of the constant ratio. The first and second capacitors can be inherent capacitances of the crystal itself.

The system can include a second frequency tuning circuit coupled to the first node of the crystal, where the second frequency tuning circuit can include switchable sections to adjust the frequency tuning of the crystal oscillator. The analogically-controlled input can be coupled to a commonly-shared node in the switchable sections in the second frequency tuning circuit. The commonly-share node can be configured to control the varactor within each of the switchable sections in the second frequency tuning circuit. The digitally-controlled input can be coupled to a switch in each of the switchable sections in the second frequency tuning circuit to control an electrical connection or disconnection of one or more switchable sections in the second frequency tuning circuit from the first node of the crystal oscillator.

The system can include a receiver, transmitter, or transceiver, in which the crystal oscillator can couple into the receiver, transmitter, or transceiver. The system can include other devices, where the crystal oscillator can couple with those devices. Some of the devices may include computers, processors, clocks, radios, signal generators, counters, test and measurement equipment, function generators, oscilloscopes, phase-locked loops, frequency synthesizers, phones, wireless communication devices, and devices for the production and transmission of music and video. In some implementations, the switches can be transmission gate switches. The frequency tuning circuits can involve single-ended or fully-differential circuits.

In general, some implementations can feature a method for manufacturing a frequency tuning circuit of a crystal oscillator. The method involves forming the crystal oscillator by coupling an amplifier with a crystal. The method includes forming a first switched-capacitor frequency tuning circuit that includes switchable sections to adjust the tuning of the crystal oscillator. Each of the switchable sections in the first switched-capacitor frequency tuning circuit includes a fixed capacitor in series with a varactor and a switch. The method includes coupling the first switched-capacitor frequency tuning circuit to a first node of the crystal, and coupling an analog control input to a node within each of the switchable sections. The node within each of the switchable sections includes a node to control the varactor within the switchable sections. The method involves coupling a digital control input to the switchable sections, where the digital control input is configured to electrically connect or disconnect one or more of the switchable sections from the first node of the crystal.

These and other implementations can optionally include one or more of the following features. A ratio between a capacitance of the varactor to a capacitance of the fixed capacitor can include a constant ratio for the switchable sections in the first switched-capacitor frequency tuning circuit. A total equivalent capacitance of the switched-capacitor frequency tuning circuit can be a function of the constant ratio. The crystal can have capacitances that are inherent with the crystal in achieving a nominal tuning frequency.

The method can include coupling a second switched-capacitor frequency tuning circuit to a second node of the crystal, in which the second switched-capacitor frequency tuning circuit can include switchable sections to adjust the tuning of the crystal oscillator. The switchable sections in the second switched-capacitor frequency tuning circuit can include a fixed capacitor in series with a varactor and a switch. The method an include coupling the analog control input to a node within each of the switchable sections in the second switched-capacitor frequency tuning circuit. The method can also involve coupling the digital control input to a switch within the switchable sections in the second switched-capacitor frequency tuning circuit to electrically connect or disconnect one or more switchable sections from the crystal. In some implementations, additional switched-capacitor frequency tuning circuits can be coupled to the crystal oscillator for further tuning and adjustment.

Particular implementations may provide one or more following potential advantages. The disclosed techniques facilitate precise frequency tuning of an electronic crystal oscillator that has a digital control and an analog control for frequency tuning. Some advantages of the disclosed designs and techniques may include allowing a tuning range for the digital section of the oscillator tuning circuitry to be independently controlled from the analog section of the oscillator tuning circuitry. By having independent control between the digital and analog tuning mechanisms, the digital tuning selections do not have to impact the analog tuning range and vice-versa. The independent control can also improve tuning range variations and sensitivities over conventional analog and digital tuning techniques. These improvements can be achieved with a smaller die area and lower manufacturing costs than conventional analog and digital controls for the frequency tuning. In some implementations, tuning ranges can be maintained constant for the crystal oscillator by keeping a ratio of varactor capacitance to fixed capacitance constant using capacitors in tank circuits, where the tuning ranges can be adjusted via a switched capacitor network of capacitors and varactors.

Another potential advantage includes not requiring exact matching of the capacitances between the fixed capacitors and varactors for the tuning circuit. The disclosed designs can be differential designs that can reduce spurious noise. An additional benefit of the disclosed designs involves producing fine and precise tuning ranges of the crystal oscillator by implementing segments of capacitors and varactors in one or more tunable switched capacitor networks where the capacitances of the capacitors and varactors within each segment can differ from each other within and/or among the tunable switched capacitor networks. As an additional benefit, the oscillator can be tuned by varying one or more parameters of multiple frequency tuning options, such as by varying the capacitance of the segments, varying a number of connected segments, varying the on and off switching ratios, varying a number of switched capacitance networks in series, and varying the values of $V_{DAFC}$ and/or $V_{AFC}$. The disclosed designs provide the additional potential benefits of having multiple and/or concurrent degrees of freedom to tune the frequency of the crystal oscillator.

Details of one or more implementations are set forth in the accompanying drawings and the description herein. Other features, aspects, and advantages will be apparent from the description, the drawings, and the claims.

DESCRIPTION OF THE DRAWINGS

Like reference numbers and designations in the various drawings indicate like elements.

DETAILED DESCRIPTION

Figure 1:
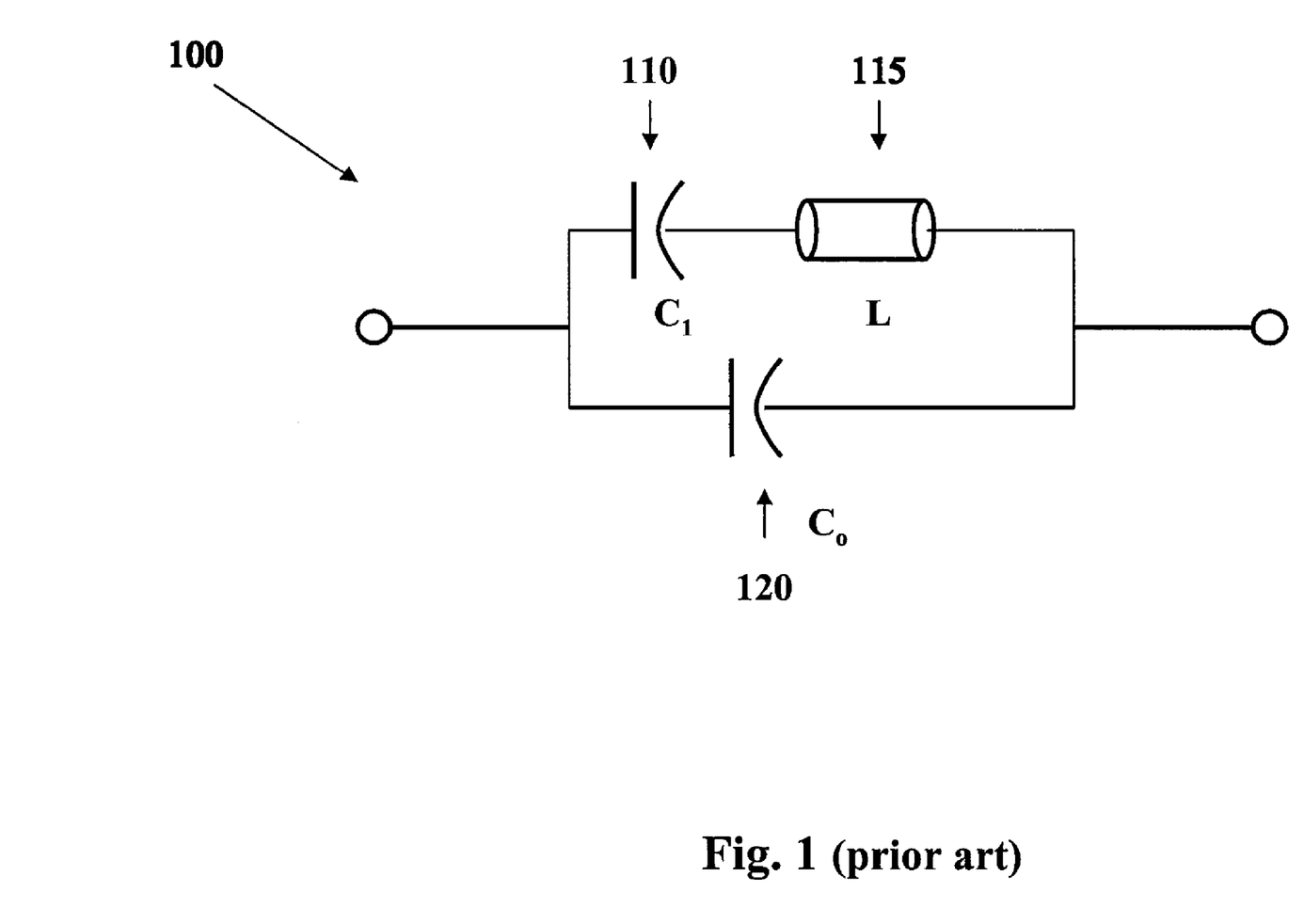
FIG. 1 is a model of a crystal device as a passive L and C network.

FIG. 1 shows a simplified model 100 of the crystal device as a passive L and C network, with capacitor elements C1 110, Co 120, and inductor element L 115. Capacitor Co 120 represents the parallel plate capacitance, such as the capacitance from wires and contacts. Capacitor C1 110 and inductor L 115 represent the energy storage units in the model. Since the quartz crystal has a high Q value, the series capacitance C1 110 is very low and the series inductance L 115 is very high.

There are a few conventional methods of controlling the crystal oscillator frequency. By modeling the crystal as a high quality L-C resonator as in FIG. 1, the resonant frequency of the crystal can be "pulled" by adding parallel and/or series resonant components, such as capacitors as loads to the resonant circuit. The pulling can be done, for example, through analog controlling a variable capacitor device (varactor) or through digital means via tuning a weighted array of capacitor.

Figure 2:
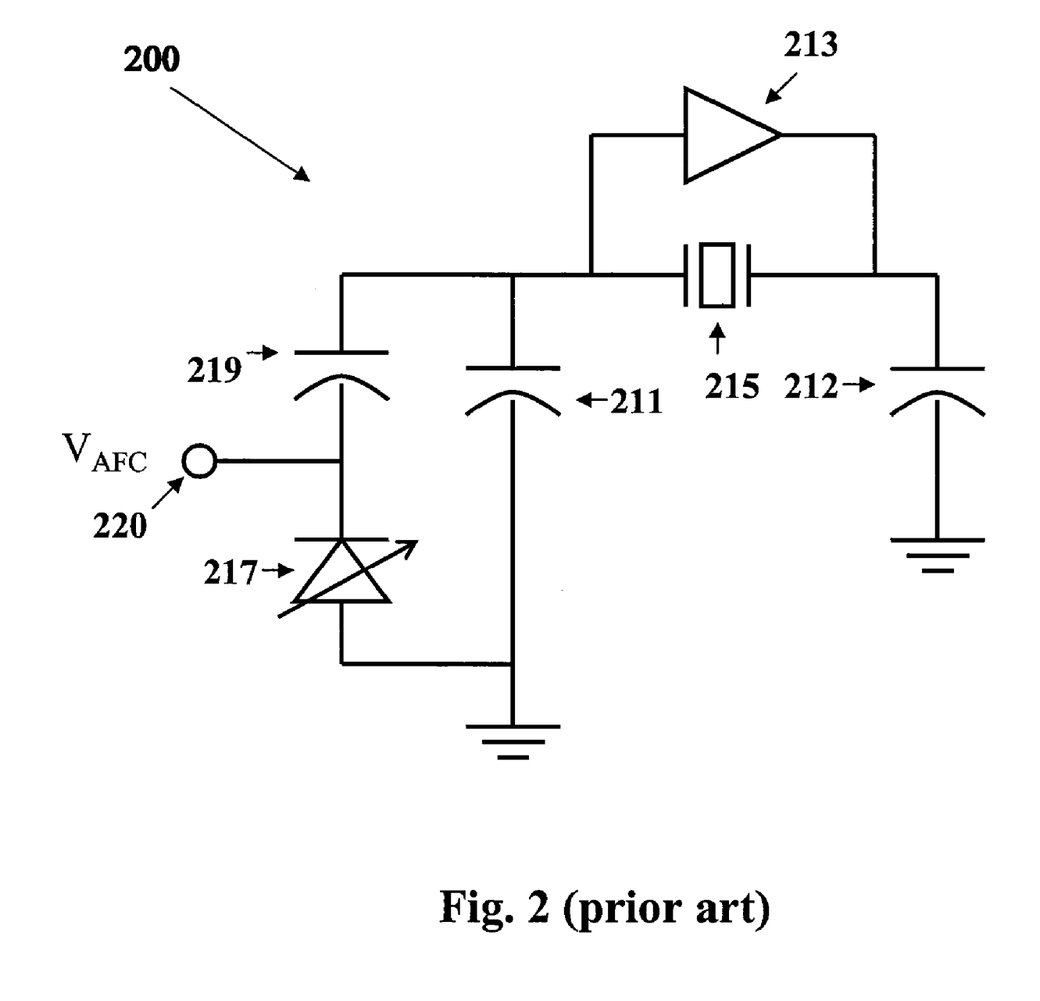
FIG. 2 shows a model of a conventional crystal oscillator circuit.

FIG. 2 shows a model 200 of a conventional crystal oscillator circuit. FIG. 2 shows an example where the resonant frequency of the crystal can be "pulled" through analog control of a variable capacitor device, varactor 217. In FIG. 2, an inverting amplifier 213 is put in parallel with a crystal 215 to form a crystal oscillator circuit. The parallel load capacitors 211 and 212 are used to set a nominal fixed frequency of the resonant circuit. The varactor 217 is tuned by an analog control voltage 220, $V_{AFC}$, which is used to tune the frequency of the crystal oscillator. The varactor 217 is coupled to the crystal 215 through a capacitor 219. Analog control circuit topologies other than the model 200 shown in FIG. 2 may be designed, such as topologies using dual varactors or topologies that couple the varactor to the crystal 215 with resistors instead of capacitors.

Figure 3:
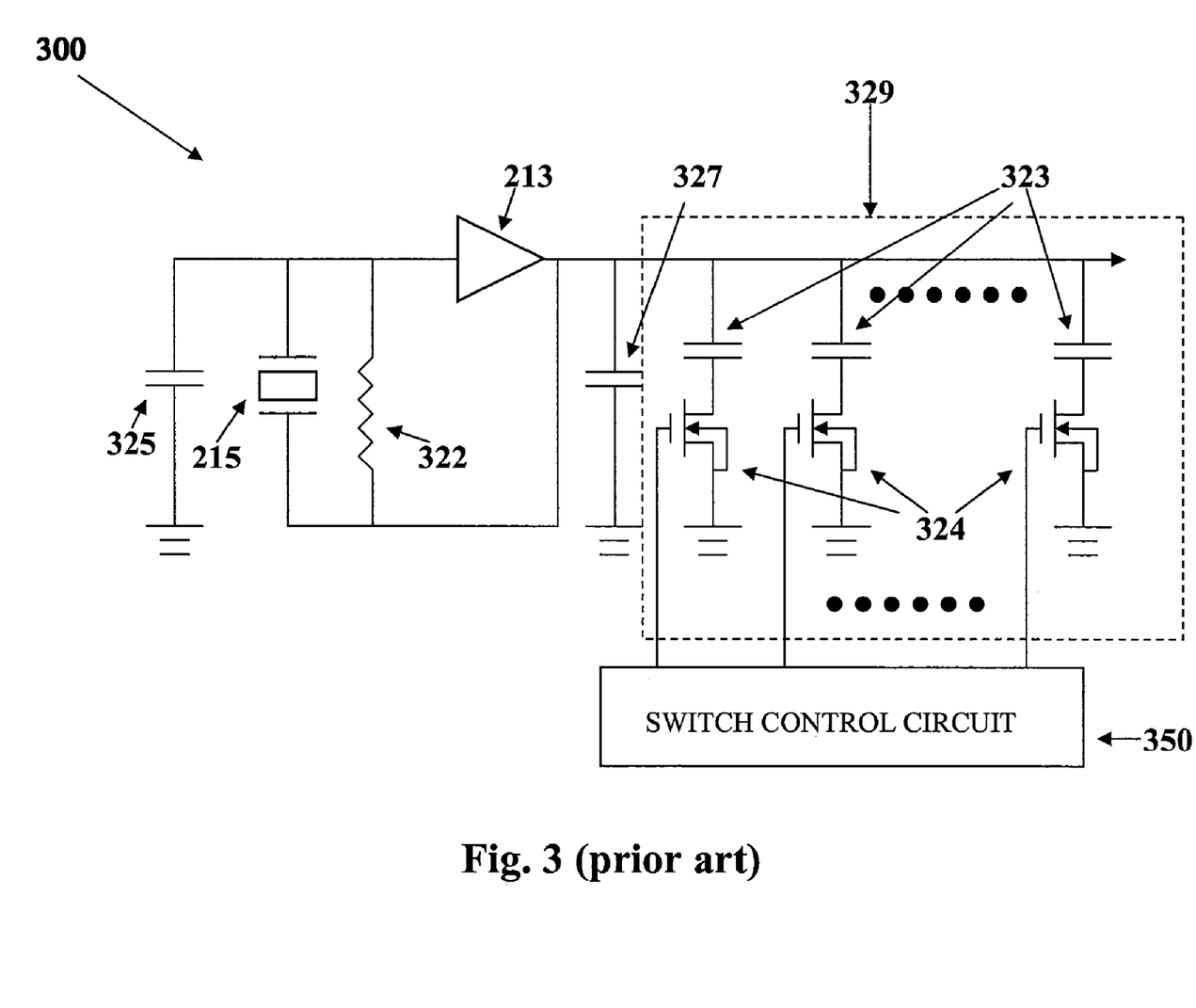
FIG. 3 is a model of a conventional digitally-controlled crystal oscillator.

FIG. 3 shows a model 300 of a conventional crystal oscillator circuit. FIG. 3 shows an example where the resonant frequency of the crystal can be "pulled" through digital means by tuning a weighted array of capacitors. An advantage of using digital control (e.g., FIG. 3) in contrast with analog control (e.g., FIG. 2) is that the digital control circuits can be more easily implemented and integrated into an overall integrated circuit system, especially for circuit implementations using digital process technologies. Another advantage that digital control has over analog control is that the digital control can be more easily controlled since the digital control is performed through digital processor circuitry rather than analog techniques. The digitally-controlled frequency tuning design may be referred to as a digitally-compensated crystal oscillator (DCXO). In some implementations, by using a switched capacitor array for load capacitance, the range of tuning can be improved over what is achievable with an analog varactor.

FIG. 3 has amplifier 213 in parallel with the crystal 215. A digitally programmable switched-capacitor array 329 has capacitors 324 and switches 323. The array 329 can be a tunable load that is in parallel with load capacitors 325, 327. The switches 323 in the array 329 are controlled by a switch control circuit 350. Although a single-ended load is shown in the example embodiment of FIG. 3, either a single-ended or differential load can be used.

In order to achieve a large number of bits of digital control and have monotonic accuracy, large devices need to be used to obtain good matching amongst the switches 324. The example embodiment of FIG. 3 can also require complex calibration schemes to reduce mismatch. As a result, there can be a substantial amount of die area and/or complexity required to obtain a good digital-bit resolution in conventional designs.

In some embodiments, circuits can be combined to tune a crystal oscillator with both a digital control and an analog control to achieve higher resolutions (e.g., higher than 10 bits of resolution). With conventional techniques using both analog and digital controls, the analog and digital controls are not independent of each other. Also, one type of control (e.g., analog control) can degrade a performance of another other type of control (e.g., digital control) with conventional techniques that employ two different types of controls. Conventional tuning circuits can have a wide variation in tuning ranges because the digital tuning circuit can adversely impact the analog tuning range and vice-versa. This adverse impact can force a substantial uncertainty in the tuning ranges and can also lead to difficulty in process variation control. The interactions between conventional analog and digital controls can require higher resolution tuning controls in order to meet minimum and maximum tuning ranges and step sizes for frequency tuning.

Figure 4:
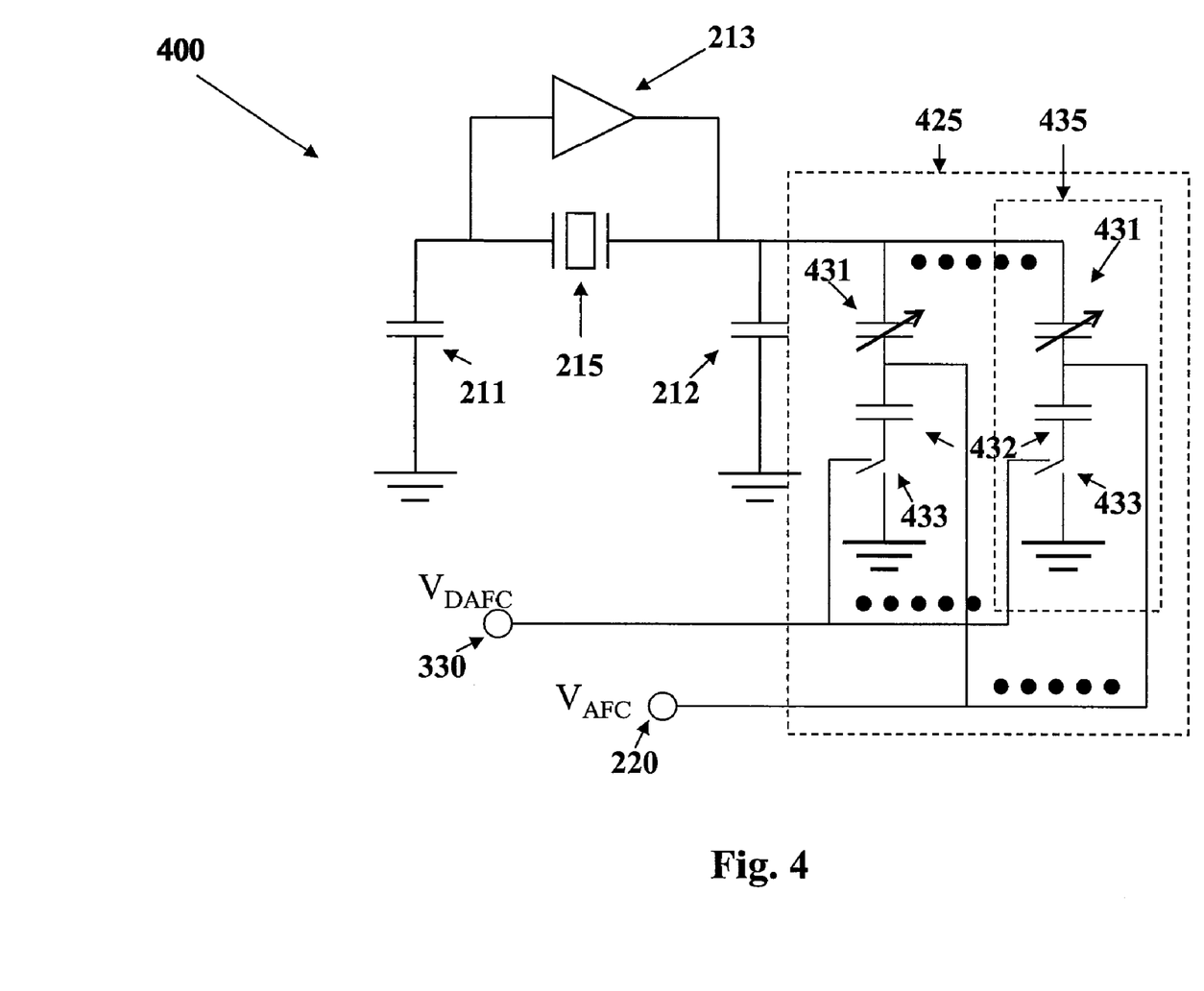
FIG. 4 is an example embodiment of the disclosed tuning technique.

FIG. 4 is an example embodiment of a model 400 for a disclosed tuning technique. In FIG. 4, the inverting amplifier 213 is in parallel with the crystal 215, and the capacitor loads 211 and 212 are fixed tuning capacitor loads to be used to set the nominal oscillator frequency. A switched capacitor network 425 includes varactors 431, tuning capacitors 432 and switches 433. The switches 433 are controlled by the digital signal $V_{DAFC}$ 330 to on or off positions to connect or disconnect both the varactors 431 and the capacitors 432. The digital signal $V_{DAFC}$ 330 can have a multi-bit digital code to set the on or off positions of the switches 433. The switched capacitor network 425 couples to a load capacitor 212 to tune the crystal oscillator.

An analog control $V_{AFC}$ 220 is connected to a node between respective varactors 431 and capacitors 432 to tune the varactors 431 and capacitors 432 independently of the digital control $V_{DAFC}$. The analog control $V_{AFC}$ 220 can be used to adjust the capacitance for respective varactors 431.

By using switches 433 to connect or disconnect the varactors 431 and the capacitors 432 to a voltage terminal (e.g., a ground terminal), the ratio between the capacitance of the varactors 431 to the capacitance of the capacitors 432 can be maintained at a constant ratio, regardless of the digital code of the digital signal $V_{DAFC}$ 330. This constant ratio for the capacitance can maintain the independence of the analog control range and the digital control range.

Mathematically, the ratio for the capacitance can be expressed by equations relating to series and parallel capacitance networks. In some embodiments, a given switchable section of the switched-capacitor network can have a fixed value, $C_{fix}$, and the varactor can have a variable capacitance range value of $C_{var}$. FIG. 4, for example, shows an embodiment where each switchable section 435 of the switched-capacitor network 425 includes a capacitor 432 in series with a varactor 431 and a digitally-controllable switch 433.

In some embodiments, each switchable section i can be expressed as a bit in the digital signal $V_{DAFC}$ 330. A total capacitance for the switchable section i can expressed by the equation $C_{section\_i} = C_{fix\_i} * C_{var\_i}/(C_{fix\_i} + C_{var\_i})$. By scaling each switchable section i of the switched capacitor network 425 as a scaled up or down version of a capacitance of a reference switchable section, $C_{section\_i}$, the total load capacitance of section i of the network 425 can be expressed as $C_{L\_i} = k_i * C_{section\_i} = k_i * C_{fix\_i} * C_{var\_i}/(C_{fix\_i} + C_{var\_i})$, where k represents a positive numerical value that is a function of digital signal $V_{DAFC}$, and i represents a positive number from 1 to n, where n represents a number of bits in the digital signal $V_{DAFC}$ 330. The capacitance values of $C_{var\_i}$ and, in part, $C_{section\_i}$ are functions of $V_{AFC}$ 220. The total load capacitance of the network 425 can be expressed as $C_{total} = \Sigma_{i=1, \ldots n} C_{L\_i} = \Sigma_{i=1, \ldots n} k_i * C_{fix\_i} * C_{var\_i}/(C_{fix\_i} + C_{var\_i})$.

A tuning sensitivity of a crystal, $\Delta f/f$, can be expressed as $\Delta f/f = C_1/[2*(C_0 + C_{total})]$, where $C_{total}$ represents the crystal load capacitance and $C_1$ and $C_0$ represent the crystal parameters, as shown in FIG. 1. In some typical embodiments, $C_{total}$ is much greater than $C_0$ and $C_{total}$ is equal to $\Sigma_{i=1, \ldots n} C_{L\_i}$, so that the tuning sensitivity, $\Delta f/f$, is approximately equal to $C_1/[\Sigma_{i=1, \ldots n}(2*C_{L\_i})] = C_1/[\Sigma_{i=1, \ldots n}(2*k_i*C_{section\_i})] = C_1/\{\Sigma_{i=1, \ldots n}[(2*k_i*C_{fix\_i}*C_{var\_i})/(C_{fix\_i} + C_{var\_i})]\}$.

If $C_{fix\_i} = C_{fix}$ and $C_{var\_i} = C_{var}$, then $\Delta f/f = C_1 * (C_{fix} + C_{var})/[(2*C_{fix}*C_{var})*(\Sigma_{i=1, \ldots n} k_i)]$.

For the digital tuning, the multi-bit digital code can adjust the value of $k_i$ to generate a load capacitance, $C_{L\_i}$, such that the crystal resonant frequency is tuned to the correct oscillating frequency. The value of $k_i$ can be a function of $V_{DAFC}$ 330. In some embodiments, $k_i$ can be expressed as an average ratio of on-to-off switching of a switchable segment i. Regardless of the number of switchable sections i in the switched capacitor network 425 that are activated when the switches 433 are switched in the on position, the total load capacitance $C_{L\_i}$ can vary by the same percentage ratio over the analog tuning range of values, which can be set, in part, by the varactor capacitance $C_{var\_i}$. As a potential benefit, the analog tuning range can be preserved relatively independent of the digital code that is used to coarse tune the resonant frequency of the crystal oscillator. As an additional potential benefit, the oscillator frequency can be tuned by varying one or more of multiple tuning parameters, such as by varying the capacitance of the segments, varying the number of connected segments, and varying the values of $V_{DAFC}$ 330 and/or $V_{AFC}$ 220. Some other options for varying the frequency tuning range are described below.

Figure 5:
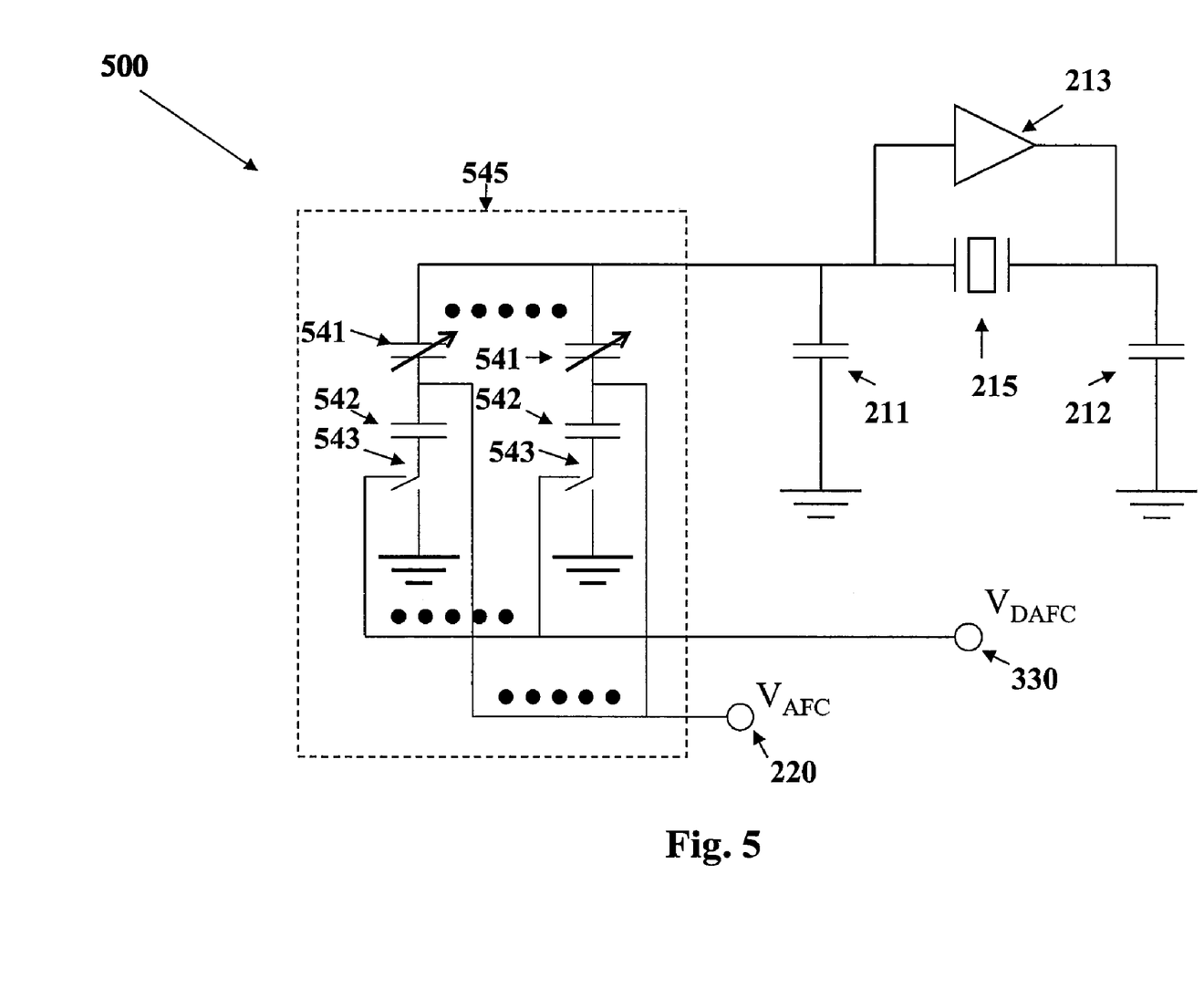
FIG. 5 is an example embodiment of the disclosed tuning technique.

FIG. 5 shows an example embodiment of a model 500 for a disclosed tuning technique. In the embodiment of FIG. 5, the inverting amplifier 213 is placed in parallel with crystal 215. The fixed load capacitors 211 and 212 can provide a nominal tuning of the oscillator frequency. A switched capacitor network 545 includes varactors 541, tuning capacitors 542, and switches 543. The switches 543 are controlled by the digital signal $V_{DAFC}$ 330 to on or off positions to connect or disconnect the varactors 541 and the capacitors 542. The digital signal $V_{DAFC}$ 330 can have a multi-bit digital code to set the on or off positions of the switches 543. An analog control $V_{AFC}$ 220 is connected to a node between respective varactors 541 and capacitors 542 to tune the varactors 541 and capacitors 542 independently of the digital control $V_{DAFC}$ 330. The switched capacitor network 545 couples to load capacitor 211 to tune the crystal oscillator.

Figure 6:
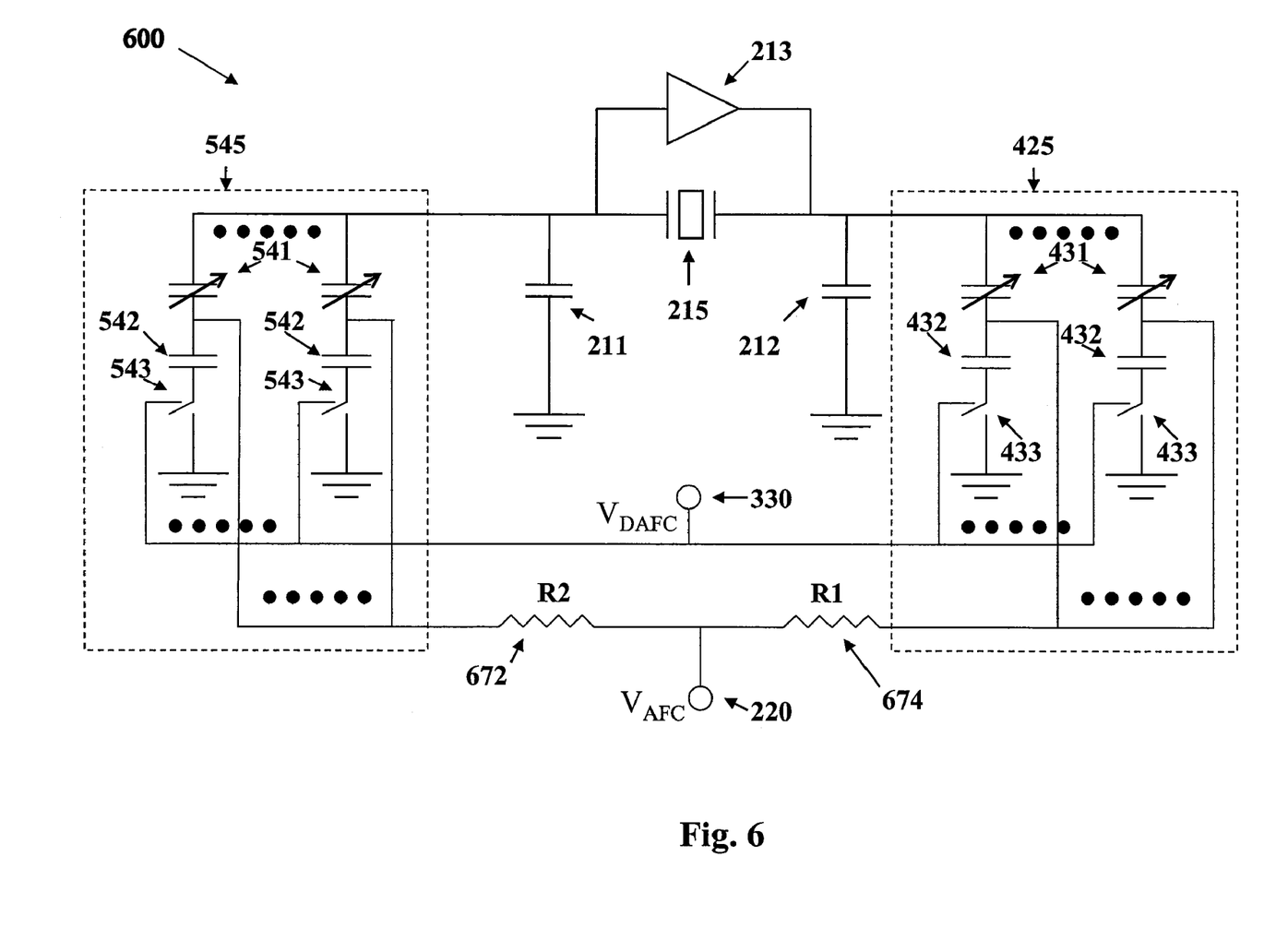
FIG. 6 is an example embodiment of the disclosed tuning technique.

FIG. 6 shows an example embodiment of a model 600 for the disclosed tuning technique. In the embodiment of FIG. 6, the inverting amplifier 213 is placed in parallel with crystal 215. The fixed load capacitors 211 and 212 can provide a nominal tuning of the oscillator frequency. FIG. 6 has two switch capacitor networks 425, 545.

Switched capacitor network 545 includes varactors 541, tuning capacitors 542, and switches 543. The switches 543 are controlled by the digital signal $V_{DAFC}$ 330 to on or off positions to connect or disconnect the varactors 541 and the capacitors 542. The digital signal $V_{DAFC}$ 330 can have a multi-bit digital code to set the on or off positions of the switches 543. An analog control $V_{AFC}$ 220 couples through a resistor 672 to a node between respective varactors 541 and capacitors 542 to tune the varactors 541 and capacitors 542 independently of the digital control $V_{DAFC}$ 330. The switched capacitor network 545 couples to load capacitor 211 to tune the crystal oscillator.

Switched capacitor network 425 includes varactors 431, tuning capacitors 432, and switches 433. The switches 433 are also controlled by the digital signal $V_{DAFC}$ 330 to on or off positions to connect or disconnect the varactors 431 and the capacitors 432. The digital code of the digital signal $V_{DAFC}$ 330 can set the positions of the switches 433. The analog control $V_{AFC}$ 220 couples though a resistor R1 674 to a node between respective varactors 431 and capacitors 432 to tune the varactors 431 and capacitors 432 independently of the digital control $V_{DAFC}$. The switched capacitor network 425 couples to a load capacitor 212 to tune the crystal oscillator. FIG. 6 shows two switched capacitor networks 425, 545 that are separated by resistors 672, 674 on one end. The resistors 672, 674 can prevent charge-sharing between the two networks 425, 545.

If the capacitances 542, 543 of each segment within each of the networks are the same within each network, then a load capacitance can be generated similar to FIG. 4 for each network 425, 545. For example, networks 425, 545 are in series in FIG. 6. The total load capacitance of both of the networks 425, 545 as seen by the oscillator can be expressed as $C_{Ltotal\_6} = C_{total4} * C_{total5} / (C_{total4} + C_{total5})$, where $C_{total4}$ is the load capacitance of network 425 as expressed above in the example embodiment of FIG. 4, and $C_{total5}$ is the load capacitance of network 545 as an analogous network embodiment. In other embodiments, the model 600 of FIG. 6 can be extended to include more than two switched capacitor networks.

In other embodiments of FIGS. 4-6, the oscillator can be tuned to varying amounts of resolutions, including finer resolutions. In some embodiments, the values of the fixed capacitances can vary between and/or within their switched capacitor networks.

In other embodiments of FIGS. 4-6, the value of $k_i$ can represent the average on and off switching ratio for switchable segment i, and can vary between segments within a switched capacitor network. For example, $C_{fix\_i}$ and $C_{var\_i}$ can have the same capacitances for each switchable segment i in a network, but the average on and off switching ratio can be increased by a factor of r for consecutive segments, where r>1. For this example, the total load capacitance of the network can be scaled by a factor of $(r^n-1)/(r-1)$. In other embodiments, the scaling factor of $(1-r^n)/(1-r)$ may be obtained if r<1.

In other embodiments of FIGS. 4-6, if the average on and off switching ratio is kept the same for consecutive segments within the network, and the capacitance values of $C_{fix\_i}$ and $C_{var\_i}$ are the same within each segment, but are increased by a factor of r for consecutive segments, then the total load capacitance of the network can be scaled by a factor of $(r^n-1)/(r-1)$. For example, if r=2, then the total load capacitance of the network can be scaled by a factor of $2^n-1$. In other embodiments, the scaling factor of $(1-r^n)/(1-r)$ may be obtained if r<1. In some embodiments of FIGS. 4-6, if the capacitance values of $C_{fix\_i}$ and $C_{var\_i}$ are increased by a factor of s for each consecutive segment and the average on and off switching ratio is increased by a factor of r for consecutive segments (for r>1), then the total load capacitance of the network can be increased by a factor of $((r*s)^n-1)/(r*s-1)$. In an example, if the capacitance factor and the switching ratio are doubled for consecutive segments, then the scaling factor is $(4^n-1)/3$. In other embodiments, the scaling factor of $((r*s)^n-1)/(r*s-1)$ may be obtained if r<1 or s<1.

In some embodiments, the example embodiments of FIGS. 4-6 can be implemented in fully-differential designs. The fully-differential designs can provide the benefits of improved performance by reducing spurious noise even further than the example embodiments shown in FIGS. 4-6.

While all of the implementations presented herein use single-ended structures, differential structures can be used in their place with the added advantages of improved symmetry and increased robustness to noise. In addition, various topologies for oscillators and parallel or series resonant loads for tuning the oscillator can also be used. The positions of the switches, capacitors, and varactors can be exchanged with minimal change in circuit functionality. Various topologies for oscillator circuit models can also be used, other than what is shown in FIG. 1. The exemplary designs shown are not limited to CMOS process technology, but may also use other process technologies, such as BiCMOS (Bipolar-CMOS) process technology, or Silicon Germanium (SiGe) technology. The disclosed techniques can be used with oscillators for many systems, including wireless communication systems. For example, the disclosed techniques can be used with oscillators for receivers and transceivers, such as the receiver and transceiver architectures for superheterodyne receivers, image-rejection (e.g., Hartley, Weaver) receivers, zero-intermediate frequency (IF) receivers, low-IF receivers, direct-up transceivers, two-step up transceivers, and other types of receivers and transceivers for wireless and wireline technologies. In some embodiments, the disclosed techniques can be used with crystal oscillators that are coupled in devices, such as computers, processors, clocks, radios, signal generators, counters, test and measurement equipment, function generators, oscilloscopes, phase-locked loops, frequency synthesizers, phones, wireless communication devices, and devices for the production and transmission of music and video. In some embodiments, the switches can be transmission gate switches. Other modifications are within the scope of the following claims.

What is claimed is:

1. A method for tuning a frequency of a crystal oscillator, the method comprising:

adjusting the tuning frequency of the crystal oscillator from a nominal frequency via a first switched-capacitor frequency tuning circuit, the crystal oscillator comprising an amplifier and a crystal and the first switched-capacitor frequency tuning circuit being coupled to a first node of the crystal, wherein the first switched-capacitor frequency tuning circuit comprises a plurality of switchable sections to adjust the tuning of the crystal oscillator, and wherein the plurality of switchable sections in the first switched-capacitor frequency tuning circuit comprises an analog control input and a digital control input;

controlling the analog control input coupled to a node within each of the plurality of switchable sections, wherein each of the plurality of switchable sections in the first switched-capacitor frequency tuning circuit comprises a fixed capacitor in series with a varactor and a switch, and wherein the node within each of the plurality of switchable sections comprises a node to control the varactor within each of the plurality of switchable sections; and controlling the digital control input, wherein the digital control input is configured to electrically connect or disconnect one or more of the switchable sections from the first node of the crystal, wherein a capacitance for a switchable section i of the plurality of switchable sections comprises $C_{section\_i}$, wherein $C_{section\_i}$ is equivalent to $C_{fix\_i} * C_{var\_i} / (C_{fix\_i} + C_{var\_i})$, wherein i represents a positive number from 1 to n, wherein n represents a number of bits for the digital control input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i * C_{section\_i}$, wherein $k_i$ represents a positive numerical value for the switchable section i that is a function of the digitally-controlled input, wherein a total load capacitance of the first switched-capacitor frequency tuning circuit comprises $C_{total}$, wherein $C_{total}$ is equivalent to $\Sigma_{i=1\ldots n}C_{L\_i}$, and wherein $C_{total}$ is equivalent to $\Sigma_{i=1\ldots n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $(r^n-1)/(r-1)$ for which the average on and off switching ratio is scaled higher by a factor of r for consecutive switchable sections in which r>1, or the total load capacitance is scaled by a factor of $(1-r^n)/(1-r)$ for which the average on and off switching ratio is scaled by a factor of r for consecutive switchable sections in which r<1.

2. The method of claim 1, wherein the node to control the varactor within each of the plurality of switchable sections is a common node in all of the switchable sections in the first switched-capacitor frequency tuning circuit.

3. The method of claim 2, further comprising receiving a multi-bit digital code on the digital control input to control the electrical connection or disconnection of each of the switchable sections, wherein each bit in the multi-bit digital code is configured to control a connection or disconnection of the switch within one of the switchable sections in the first switched-capacitor frequency tuning circuit.

4. The method of claim 3, further comprising:

adjusting the tuning frequency of the crystal oscillator from a nominal frequency via a second switched-capacitor frequency tuning circuit that is coupled to a second node of the crystal, the second switched-capacitor frequency tuning circuit comprising a plurality of switchable sections to adjust the tuning of the crystal oscillator, wherein each of the plurality of switchable sections in the second switched-capacitor frequency tuning circuit comprises a fixed capacitor in series with a varactor and a switch, and wherein the plurality of switchable sections in the second switched-capacitor frequency tuning circuit comprises the analog control input and the digital control input;

controlling the analog control input to each of the plurality of switchable sections in the second switched-capacitor frequency tuning circuit, wherein the analog control input is coupled to a node within each of the plurality of switchable sections in the second switched-capacitor frequency tuning circuit, wherein the node within each of the plurality of switchable sections in the second switched-capacitor frequency tuning circuit comprises a node to control the varactor within each of the plurality of switchable sections; and controlling the digital control input that is coupled to the switch within each of the plurality of switchable sections in the second switched-capacitor frequency tuning circuit to electrically connect or disconnect one or more switchable sections from the crystal.

5. The method of claim 1, wherein a tuning sensitivity of the crystal is a function of $C_1/[2*(C_0+C_{total})]$, wherein $C_1$ and $C_0$ represent crystal parameters.

6. A method for manufacturing a frequency tuning circuit of a crystal oscillator, the method comprising:

forming the crystal oscillator by coupling an amplifier with a crystal;

forming a first switched-capacitor frequency tuning circuit comprising a plurality of switchable sections to adjust the tuning of the crystal oscillator; wherein each of the plurality of switchable sections in the first switched-capacitor frequency tuning circuit comprises a fixed capacitor in series with a varactor and a switch;

coupling the first switched-capacitor frequency tuning circuit to a first node of the crystal;

coupling an analog control input to a node within each of the plurality of switchable sections, wherein the node within each of the plurality of switchable sections comprises a node to control the varactor within each of the plurality of switchable sections;

coupling a digital control input to each of the plurality of switchable sections, wherein the digital control input is configured to electrically connect or disconnect one or more of the switchable sections from the first node of the crystal, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digital control input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first switched-capacitor frequency tuning circuit comprises $C_{total}$, wherein $C_{total}$ is equivalent to $\Sigma_{i=1\ldots n}C_{L\_i}$, and wherein $C_{total}$ is equivalent to $\Sigma_{i=1\ldots n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $(r^n-1)/(r-1)$ for which the average on and off switching ratio is scaled higher by a factor of r for consecutive switchable sections in which r>1, or the total load capacitance is scaled by a factor of $(1-r^n)/(1-r)$ for which the average on and off switching ratio is scaled by a factor of r for consecutive switchable sections in which r<1.

7. The method of claim 6, wherein a tuning sensitivity of the crystal is a function of $C_1/[2*(C_0+C_{total})]$, wherein $C_1$ and $C_0$ represent crystal parameters.

8. The method of claim 5, further comprising:

coupling a second switched-capacitor frequency tuning circuit to a second node of the crystal, the second switched-capacitor frequency tuning circuit comprising a plurality of switchable sections to adjust the tuning of the crystal oscillator, wherein each of the plurality of switchable sections in the second switched-capacitor frequency tuning circuit comprises a fixed capacitor in series with a varactor and a switch;

coupling the analog control input to a node within each of the plurality of switchable sections in the second switched-capacitor frequency tuning circuit; and coupling the digital control input to a switch within each of the plurality of switchable sections in the second switched-capacitor frequency tuning circuit to electrically connect or disconnect one or more switchable sections from the crystal.

9. A circuit for tuning a frequency of a crystal oscillator, the circuit comprising:

an oscillator circuit comprising an amplifier in parallel with a crystal;

a first capacitor coupled to a first node of the crystal;

a second capacitor coupled to a second node of the crystal, wherein the first and second capacitors are configured for nominal tuning of the crystal oscillator;

a first switched-capacitor frequency tuning circuit coupled to the second node of the crystal, the first switched-capacitor frequency tuning circuit comprising a plurality of switchable sections to adjust the tuning of the crystal oscillator;

an analog control input coupled to a varactor within each of the plurality of switchable sections; and a digital control input coupled to a switch within each of the plurality of switchable sections to electrically connect or disconnect one or more of the switchable sections from the second node of the crystal, wherein each of the plurality of switchable sections comprises a fixed capacitor and the varactor, wherein a capacitance for a switchable section i of the plurality of switchable sections wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digital control input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first switched-capacitor frequency tuning circuit comprises $C_{total}$, wherein $C_{total}$ is equivalent to $\Sigma_{i=1...n}C_{L\_i}$, and wherein $C_{total}$ is equivalent to $\Sigma_{i=1...n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $(r^n-1)/(r-1)$, wherein the average on and off switching ratio is scaled higher by a factor of r for consecutive switchable sections, and wherein r>1.

10. The circuit of claim 9, wherein in each of the plurality of switchable sections, the fixed capacitor is coupled in series with the varactor and the switch.

11. The circuit of claim 10, wherein the analog control input is configured to control the varactor within each of the plurality of switchable sections in the first switched-capacitor frequency tuning circuit.

12. The circuit of claim 11, wherein the digital control input is configured to carry a multi-bit digital code, wherein each bit in the multi-bit digital code is configured to control an on or off position of the switch in one of the switchable sections in the first switched-capacitor frequency tuning circuit.

13. The circuit of claim 12, wherein the digital control input is configured to be independent of the analog control input.

14. The circuit of claim 13, wherein a tuning sensitivity of the crystal is a function of a constant ratio between the capacitance of the varactor and the capacitance of the fixed capacitor for each switchable section in the first switched-capacitor frequency tuning circuit.

15. The circuit of claim 14, further comprising:

a second switched-capacitor frequency tuning circuit coupled to the first node of the crystal, the second switched-capacitor frequency tuning circuit comprising a plurality of switchable sections to adjust the tuning of the crystal oscillator, wherein the analog control input is coupled to a varactor within each of the plurality of switchable sections in the second switched-capacitor frequency tuning circuit, and wherein the digital control input is coupled to a switch within each of the plurality of switchable sections in the second switched-capacitor frequency tuning circuit to electrically connect or disconnect one or more of the switchable sections from the first node of the crystal.

16. The circuit of claim 15, wherein each of the plurality of switchable sections in the second switched-capacitor frequency tuning circuit comprises a fixed capacitor in series with the varactor and the switch.

17. The circuit of claim 16, wherein the analog control input is configured to control the varactor within each of the plurality of switchable sections in the second switched-capacitor frequency tuning circuit.

18. The circuit of claim 17, wherein each bit in the multi-bit digital code is configured to control an on or off position of the switch in one of the switchable sections in the second switched-capacitor frequency tuning circuit.

19. The circuit of claim 9, wherein a tuning sensitivity of the crystal is a function of $C_1/[2*(C_0+C_{total})]$, wherein $C_1$ and $C_0$ represent crystal parameters.

20. A circuit for tuning a frequency of a crystal oscillator, the circuit comprising:

an oscillator circuit comprising an amplifier in parallel with a crystal;

a first capacitor coupled to a first node of the crystal;

a second capacitor coupled to a second node of the crystal, wherein the first and second capacitors are configured for nominal tuning of the crystal oscillator;

a first switched-capacitor frequency tuning circuit coupled to the second node of the crystal, the first switched-capacitor frequency tuning circuit comprising a plurality of switchable sections to adjust the tuning of the crystal oscillator;

an analog control input coupled to a varactor within each of the plurality of switchable sections; and a digital control input coupled to a switch within each of the plurality of switchable sections to electrically connect or disconnect one or more of the switchable sections from the second node of the crystal, wherein each of the plurality of switchable sections comprises a fixed capacitor and the varactor, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digital control input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first switched-capacitor frequency tuning circuit comprises $C_{total}$, wherein $C_{total}$ is equivalent to $\Sigma_{i=1...n}C_{L\_i}$, and wherein $C_{total}$ is equivalent to $\Sigma_{i=1...n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $(r''-1)/(r-1)$, wherein the average on and off switching ratio is scaled higher by a factor of r for consecutive switchable sections, and wherein r<1.

21. The circuit of claim 20, wherein a tuning sensitivity of the crystal is a function of $C_1/[2*(C_0+C_{total})]$, wherein $C_1$ and $C_0$ represent crystal parameters.

22. A circuit for tuning a frequency of a crystal oscillator, the circuit comprising:

an oscillator circuit comprising an amplifier in parallel with a crystal;

a first capacitor coupled to a first node of the crystal;

a second capacitor coupled to a second node of the crystal, wherein the first and second capacitors are configured for nominal tuning of the crystal oscillator;

a first switched-capacitor frequency tuning circuit coupled to the second node of the crystal, the first switched-capacitor frequency tuning circuit comprising a plurality of switchable sections to adjust the tuning of the crystal oscillator;

an analog control input coupled to a varactor within each of the plurality of switchable sections; and a digital control input coupled to a switch within each of the plurality of switchable sections to electrically connect or disconnect one or more of the switchable sections from the second node of the crystal, wherein each of the plurality of switchable sections comprises a fixed capacitor and the varactor, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digital control input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first switched-capacitor frequency tuning circuit comprises $C_{total}$, wherein $C_{total}$ is equivalent to $\Sigma_{i=1...n}C_{L\_i}$, and wherein $C_{total}$ is equivalent to $\Sigma_{i=1...n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $(r''-1)/(r-1)$, wherein the average on and off switching ratio is the same for the switchable sections in the first switched-capacitor frequency tuning circuit, wherein the capacitances of $C_{fix\_i}$ and $C_{var\_i}$ are the same within each switchable section, wherein the capacitances of $C_{fix\_i}$ and $C_{var\_i}$ are scaled by a factor of r for consecutive switchable sections.

23. The circuit of claim 22, wherein a tuning sensitivity of the crystal is a function of $C_1/[2*(C_0+C_{total})]$, wherein $C_1$ and $C_0$ represent crystal parameters.

24. A circuit for tuning a frequency of a crystal oscillator, the circuit comprising:

an oscillator circuit comprising an amplifier in parallel with a crystal;

a first capacitor coupled to a first node of the crystal;

a second capacitor coupled to a second node of the crystal, wherein the first and second capacitors are configured for nominal tuning of the crystal oscillator;

a first switched-capacitor frequency tuning circuit coupled to the second node of the crystal, the first switched-capacitor frequency tuning circuit comprising a plurality of switchable sections to adjust the tuning of the crystal oscillator;

an analog control input coupled to a varactor within each of the plurality of switchable sections; and a digital control input coupled to a switch within each of the plurality of switchable sections to electrically connect or disconnect one or more of the switchable sections from the second node of the crystal, wherein each of the plurality of switchable sections comprises a fixed capacitor and the varactor, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digital control input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first switched-capacitor frequency tuning circuit comprises $C_{total}$, wherein $C_{total}$ is equivalent to $\Sigma_{i=1...n}C_{L\_i}$, and wherein $C_{total}$ is equivalent to $\Sigma_{i=1...n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $((r*s)''-1)/(r*s-1)$, the capacitances of $C_{fix\_i}$ and $C_{var\_i}$ are scaled higher by a factor of s for each consecutive switchable section and the average on and off switching ratio is scaled higher by a factor of r for consecutive switchable sections, and wherein r>1.

25. The circuit of claim 24, wherein a tuning sensitivity of the crystal is a function of $C_1/[2*(C_0+C_{total})]$, wherein $C_1$ and $C_0$ represent crystal parameters.

26. A circuit for tuning a frequency of a crystal oscillator, the circuit comprising:

an oscillator circuit comprising an amplifier in parallel with a crystal;

a first capacitor coupled to a first node of the crystal;

a second capacitor coupled to a second node of the crystal, wherein the first and second capacitors are configured for nominal tuning of the crystal oscillator;

a first switched-capacitor frequency tuning circuit coupled to the second node of the crystal, the first switched-capacitor frequency tuning circuit comprising a plurality of switchable sections to adjust the tuning of the crystal oscillator;

an analog control input coupled to a varactor within each of the plurality of switchable sections; and a digital control input coupled to a switch within each of the plurality of switchable sections to electrically connect or disconnect one or more of the switchable sections from the second node of the crystal, wherein each of the plurality of switchable sections comprises a fixed capacitor and the varactor, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digital control input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first switched-capacitor frequency tuning circuit comprises $C_{total}$, wherein $C_{total}$ is equivalent to $\Sigma_{i=1\ldots n}C_{L\_i}$, and wherein $C_{total}$ is equivalent to $\Sigma_{i=1\ldots n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $((r*s)^n-1)/(r*s-1)$, the capacitances of $C_{fix\_i}$ and $C_{var\_i}$ are scaled higher by a factor of s for each consecutive switchable section and the average on and off switching ratio is scaled by a factor of r for consecutive switchable sections, and wherein r<1 or s<1.

27. The circuit of claim 26, wherein a tuning sensitivity of the crystal is a function of $C_1/[2*(C_0+C_{total})]$, wherein $C_1$ and $C_0$ represent crystal parameters.

28. A system comprising:
a crystal oscillator circuit;
a first capacitor coupled to a first node of the crystal oscillator circuit;
a second capacitor coupled to a second node of the crystal oscillator circuit;
a first frequency tuning circuit to adjust a frequency of the crystal oscillator circuit, the first frequency tuning circuit comprising a plurality of switchable sections, wherein each switchable section comprises a capacitor in series with a switch and a varactor;
a digitally-controlled input coupled to each switch within each switchable section to control an electrical connection or disconnection of each switchable section in the first frequency tuning circuit to the second node of the crystal oscillator circuit; and
an analogically-controlled input coupled to a commonly-shared node in all of the plurality of switchable sections in the first frequency tuning circuit, wherein the commonly-shared node is configured to control the varactor within each of the plurality of switchable sections in the first frequency tuning circuit, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digitally-controlled input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first frequency tuning circuit comprises $C_{total}$, wherein $C_{total}$ is equivalent to $\Sigma_{i=1\ldots n}C_{L\_i}$, and wherein $C_{total}$ is also equivalent to $\Sigma_{i=1\ldots n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $(r^n-1)/(r-1)$, wherein the average on and off switching ratio is scaled higher by a factor of r for consecutive switchable sections, and wherein r>1.

29. The system of claim 28, wherein the digitally-control input is independent of the analogically-control input.

30. The system of claim 29, wherein a tuning sensitivity of the crystal is a function of a constant ratio between the capacitance of the varactor and the capacitance of the capacitor for each switchable section in the first frequency tuning circuit.

31. The system of claim 29, further comprising:
a second frequency tuning circuit coupled to the first node of the crystal, the second frequency tuning circuit comprising a plurality of switchable sections to adjust the frequency tuning of the crystal oscillator,
wherein the analogically-controlled input is coupled to a commonly-shared node of each of the plurality of switchable sections in the second frequency tuning circuit, wherein the commonly-share node is configured to control the varactor within each of the plurality of switchable sections in the second frequency tuning circuit, and
wherein the digitally-controlled input is coupled to a switch in each of the plurality of switchable sections in the second frequency tuning circuit to control an electrical connection or disconnection of one or more switchable sections in the second frequency tuning circuit from the first node of the crystal oscillator.

32. The system of claim 28, further comprising a receiver, a transmitter, or a transceiver, wherein the crystal oscillator couples into the receiver, the transmitter, or the transceiver.

33. The system of claim 28, further comprising a processor, wherein the crystal oscillator couples to the processor.

34. The system of claim 28, further comprising a clock, wherein the crystal oscillator is coupled to the clock.

35. The system of claim 28, wherein a tuning sensitivity of the crystal is a function of $C_1/[2*(C_0+C_{total})]$, wherein $C_1$ and $C_0$ represent crystal parameters.

36. A system comprising:
a crystal oscillator circuit;
a first capacitor coupled to a first node of the crystal oscillator circuit;
a second capacitor coupled to a second node of the crystal oscillator circuit;
a first frequency tuning circuit to adjust a frequency of the crystal oscillator circuit, the first frequency tuning circuit comprising a plurality of switchable sections, wherein each switchable section comprises a capacitor in series with a switch and a varactor;
a digitally-controlled input coupled to each switch within each switchable section to control an electrical connection or disconnection of each switchable section in the first frequency tuning circuit to the second node of the crystal oscillator circuit; and
an analogically-controlled input coupled to a commonly-shared node in all of the plurality of switchable sections in the first frequency tuning circuit, wherein the commonly-shared node is configured to control the varactor within each of the plurality of switchable sections in the first frequency tuning circuit,
wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digitally-controlled input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first frequency tuning circuit comprises $C_{total}$, wherein $C_{total}$ is equivalent to $\Sigma_{i=1\ldots n} C_{L\_i}$, and wherein $C_{total}$ is also equivalent to $\Sigma_{i=1\ldots n} k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $(r^n-1)/(r-1)$, wherein the average on and off switching ratio is scaled higher by a factor of r for consecutive switchable sections, and wherein r<1.

37. The system of claim 36, wherein a tuning sensitivity of the crystal is a function of $C_1/[2*(C_0+C_{total})]$, wherein $C_1$ and $C_0$ represent crystal parameters.

38. A system comprising:
a crystal oscillator circuit;
a first capacitor coupled to a first node of the crystal oscillator circuit;
a second capacitor coupled to a second node of the crystal oscillator circuit;
a first frequency tuning circuit to adjust a frequency of the crystal oscillator circuit, the first frequency tuning circuit comprising a plurality of switchable sections, wherein each switchable section comprises a capacitor in series with a switch and a varactor;
a digitally-controlled input coupled to each switch within each switchable section to control an electrical connection or disconnection of each switchable section in the first frequency tuning circuit to the second node of the crystal oscillator circuit; and
an analogically-controlled input coupled to a commonly-shared node in all of the plurality of switchable sections in the first frequency tuning circuit, wherein the commonly-shared node is configured to control the varactor within each of the plurality of switchable sections in the first frequency tuning circuit, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digitally-controlled input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first frequency tuning circuit comprises $C_{total}$, wherein $C_{total}$ is equivalent to $\Sigma_{i=1\ldots n} C_{L\_i}$, and wherein $C_{total}$ is also equivalent to $\Sigma_{i=1\ldots n} k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $(r^n-1)/(r-1)$, wherein the average on and off switching ratio is the same for the switchable sections in the first frequency tuning circuit, wherein the capacitances of $C_{fix\_i}$ and $C_{var\_i}$ are the same within each switchable section, wherein the capacitances of $C_{fix\_i}$ and $C_{var\_i}$ are scaled by a factor of r for consecutive switchable sections.

39. The system of claim 38, wherein a tuning sensitivity of the crystal is a function of $C_1/[2*(C_0+C_{total})]$, wherein $C_1$ and $C_0$ represent crystal parameters.

40. A system comprising:
a crystal oscillator circuit;
a first capacitor coupled to a first node of the crystal oscillator circuit;
a second capacitor coupled to a second node of the crystal oscillator circuit;
a first frequency tuning circuit to adjust a frequency of the crystal oscillator circuit, the first frequency tuning circuit comprising a plurality of switchable sections, wherein each switchable section comprises a capacitor in series with a switch and a varactor;
a digitally-controlled input coupled to each switch within each switchable section to control an electrical connection or disconnection of each switchable section in the first frequency tuning circuit to the second node of the crystal oscillator circuit; and
an analogically-controlled input coupled to a commonly-shared node in all of the plurality of switchable sections in the first frequency tuning circuit, wherein the commonly-shared node is configured to control the varactor within each of the plurality of switchable sections in the first frequency tuning circuit, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digitally-controlled input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first frequency tuning circuit comprises $C_{total}$, wherein $C_{total}$ is equivalent to $\Sigma_{i=1\ldots n} C_{L\_i}$, and wherein $C_{total}$ is also equivalent to $\Sigma_{i=1\ldots n} k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $((r*s)^n-1)/(r*s-1)$, the capacitances of $C_{fix\_i}$ and $C_{var\_i}$ are increased by a factor of s for each consecutive switchable section, wherein the average on and off switching ratio is increased by a factor of r for consecutive switchable sections, and wherein r>1.

41. The system of claim 40, wherein a tuning sensitivity of the crystal is a function of $C_1/[2*(C_0+C_{total})]$, wherein $C_1$ and $C_0$ represent crystal parameters.

42. A system comprising:
a crystal oscillator circuit;
a first capacitor coupled to a first node of the crystal oscillator circuit;

a second capacitor coupled to a second node of the crystal oscillator circuit;

a first frequency tuning circuit to adjust a frequency of the crystal oscillator circuit, the first frequency tuning circuit comprising a plurality of switchable sections, wherein each switchable section comprises a capacitor in series with a switch and a varactor;

a digitally-controlled input coupled to each switch within each switchable section to control an electrical connection or disconnection of each switchable section in the first frequency tuning circuit to the second node of the crystal oscillator circuit; and an analogically-controlled input coupled to a commonly-shared node in all of the plurality of switchable sections in the first frequency tuning circuit wherein the commonly-shared node is configured to control the varactor within each of the plurality of switchable sections in the first frequency tuning circuit, wherein a capacitance for a switchable section i of the plurality of switchable sections comprises $C_{section\_i}$, wherein $C_{section\_i}$ is equivalent to $C_{fix\_i}*C_{var\_i}/(C_{fix\_i}+C_{var\_i})$, wherein i represents a positive number from 1 to n, wherein n represents a number of bits for the digitally-controlled input, wherein $C_{fix\_i}$ represents a capacitance of the fixed capacitor in the switchable section i, and $C_{var\_i}$ represents a variable capacitance range value of $C_{var\_i}$ for the varactor in the switchable section i, wherein a total load capacitance for the switchable section i comprises $C_{L\_i}$, wherein $C_{L\_i}$ is equivalent to $k_i*C_{section\_i}$, wherein $k_i$ represents a positive numerical value for the switchable section i that is a function of the digitally-controlled input, wherein a total load capacitance of the first frequency tuning circuit comprises $C_{total}$, wherein $C_{total}$ is equivalent to $\Sigma_{i=1\ldots n}C_{L\_i}$, and wherein $C_{total}$ is also equivalent to $\Sigma_{i=1\ldots n}k_i*C_{fix\_i}*C_{var\_i}/(C_{fix\_i}+C_{var\_i})$, wherein $k_i$ further represents an average on and off switching ratio for the switchable section i, and wherein the total load capacitance is scaled by a factor of $((r*s)^n-1)/(r*s-1)$, the capacitances of $C_{fix\_i}$ and $C_{var\_i}$ are scaled by a factor of s for each consecutive switchable section, wherein the average on and off switching ratio is scaled by a factor of r for consecutive switchable sections, and wherein r<1 or s<1.

43. The system of claim 42, wherein a tuning sensitivity of the crystal is a function of $C_1/[2*(C_0+C_{total})]$, wherein $C_1$ and $C_0$ represent crystal parameters.

* * * * *

UNITED STATES PATENT AND TRADEMARK OFFICE
CERTIFICATE OF CORRECTION

PATENT NO. : 7,639,092 B2
APPLICATION NO. : 11/837042
DATED : December 29, 2009
INVENTOR(S) : David H. Shen Page 1 of 1

It is certified that error appears in the above-identified patent and that said Letters Patent is hereby corrected as shown below:

Title Page, Col. 1, Item [75] (Inventors), line 2, delete "(US)" and insert --(US); Douglas Sudjian, Saratoga, CA (US)--, therefor.

Title Page, Col. 1, Item [73] (Assignee), lines 1-2, delete "NanoAmp Solutions Inc. (Cayman), Santa Clara, CA (US)" and insert --NanoAmp Mobile, Inc., Sunnyvale, CA (US)--, therefor.

Title Page, Col. 2, Item [56] (Other Publications), line 3, delete "PCT/SU07/75691," and insert --PCT/US07/75691,--, therefor.

Column 12, line 45 (approximately), in claim 8, delete "claim 5," and insert --claim 6,--, therefor.

Column 15, line 4, in claim 20, delete "$(r^n-1)/(r-1)$," and insert --$(1-r^n)/(1-r)$,--, therefor.

Column 15, line 5, in claim 20, after "scaled", delete "higher".

Column 17, line 24, in claim 26, after "scaled", delete "higher".

Column 19, line 20, in claim 36, delete "$(r^n-1)/(r-1)$," and insert --$(1-r^n)/(1-r)$,--, therefor.

Column 19, line 21, in claim 36, after "scaled", delete "higher".

Column 21, line 15 (approximately), in claim 42, delete "circuit" and insert --circuit,--, therefor.

Signed and Sealed this
Twenty-sixth Day of July, 2011

David J. Kappos
*Director of the United States Patent and Trademark Office*